United States Patent
Mizukami

(10) Patent No.: US 10,297,685 B2
(45) Date of Patent: May 21, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Makoto Mizukami, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/915,413

(22) Filed: Mar. 8, 2018

(65) Prior Publication Data

US 2019/0088774 A1  Mar. 21, 2019

(30) Foreign Application Priority Data

Sep. 20, 2017  (JP) .................. 2017-180357

(51) Int. Cl.
*H01L 29/78*  (2006.01)
*H01L 29/06*  (2006.01)
*H01L 29/16*  (2006.01)

(52) U.S. Cl.
CPC ...... *H01L 29/7806* (2013.01); *H01L 29/0696* (2013.01); *H01L 29/1608* (2013.01)

(58) Field of Classification Search
CPC ............ H01L 29/7806; H01L 29/0696; H01L 29/1608
See application file for complete search history.

(56) References Cited

U.S. PATENT DOCUMENTS

| | | | |
|---|---|---|---|
| 7,928,470 B2 | 4/2011 | Yamaguchi et al. | |
| 9,391,190 B2 | 7/2016 | Watanabe et al. | |
| 9,786,778 B1 | 10/2017 | Morizuka | |
| 2004/0212011 A1 | 10/2004 | Ryu | |
| 2009/0173949 A1 | 7/2009 | Yatsuo et al. | |
| 2009/0225578 A1 | 9/2009 | Kitabatake | |
| 2012/0223333 A1* | 9/2012 | Mizukami | H01L 29/1608 257/77 |
| 2015/0021680 A1 | 1/2015 | Watanabe et al. | |
| 2016/0079411 A1* | 3/2016 | Hino | H01L 29/47 257/77 |

FOREIGN PATENT DOCUMENTS

| | | | |
|---|---|---|---|
| JP | 4125363 B2 | 7/2008 | |
| JP | 4197400 B2 | 12/2008 | |
| JP | 1900662 B2 | 3/2012 | |
| JP | 5098300 B2 | 12/2012 | |

(Continued)

*Primary Examiner* — Asok K Sarkar
*Assistant Examiner* — Dmitriy Yemelyanov
(74) *Attorney, Agent, or Firm* — White & Case LLP

(57) ABSTRACT

According to an embodiment, a semiconductor device includes a first electrode, a second electrode, a first semiconductor region, a plurality of second semiconductor regions, a plurality of third semiconductor regions, a plurality of third electrodes, and a plurality of gate electrodes. The gate electrodes and the third electrodes are arranged parallel in a second direction and periodically with a third arrangement cycle such that the ratio of the number of the gate electrodes and the third electrodes in the first region is m3 to m4 (m3, m4 being positive integers and m3 being more than or equal to m4).

8 Claims, 6 Drawing Sheets

(56) References Cited

FOREIGN PATENT DOCUMENTS

| | | |
|---|---|---|
| JP | 5210518 B2 | 6/2013 |
| JP | 2015-023115 A | 2/2015 |
| JP | 5992094 B2 | 9/2016 |
| JP | 6104743 B2 | 3/2017 |
| JP | 2017-216297 A | 12/2017 |

\* cited by examiner

SEMICONDUCTOR DEVICE

CROSS-REFERENCE TO RELATED APPLICATIONS

This application is based upon and claims the benefit of priority from Japanese Patent Application No. 2017-180357, filed on Sep. 20, 2017; the entire contents of which are incorporated herein by reference.

FIELD

Embodiments of the invention relate generally to a semiconductor device.

BACKGROUND

MOSFET (metal oxide semiconductor field effect transistor) is a semiconductor device used for applications such as power control. There has been proposed a structure in which a diode is built in such a MOSFET. In the operation of the MOSFET, the drain electrode is positively biased relative to the source electrode. Thus, the current flows from the drain electrode to the source electrode. On the other hand, in the operation of the diode, the drain electrode is negatively biased relative to the source electrode. Thus, the built-in diode is turned on, and the current flows from the source electrode to the drain electrode.

In a typical MOSFET used for applications such as power control, the p-base region in contact with the source electrode serves as a p-region (anode) of the p-n diode. The n-region in contact with the drain electrode serves as an n-region (cathode) of the p-n diode. Thus, the MOSFET includes a p-n diode therein. When the drain is negatively biased at gate-off, holes flow from the p-base region in contact with the source electrode, and electrons flow from the n-region in contact with the drain electrode. Thus, the built-in diode is turned on.

However, the injected holes may compromise the reliability of the gate oxide film and the semiconductor material itself of the MOSFET. For instance, when SIC is used for the semiconductor material, the base plane dislocation part in the SiC semiconductor layer is supplied with energy generated by recombination of the injected holes and electrons. Thus, the base plane dislocation is transformed to a stacking fault. This causes a problem that the SiC semiconductor layer is turned to a high resistance layer.

Thus, in a MOSFET used for applications such as power control, there is demand for a structure suppressing hole injection at the time of operation of the built-in diode to improve reliability.

DETAILED DESCRIPTION

Figure 1:
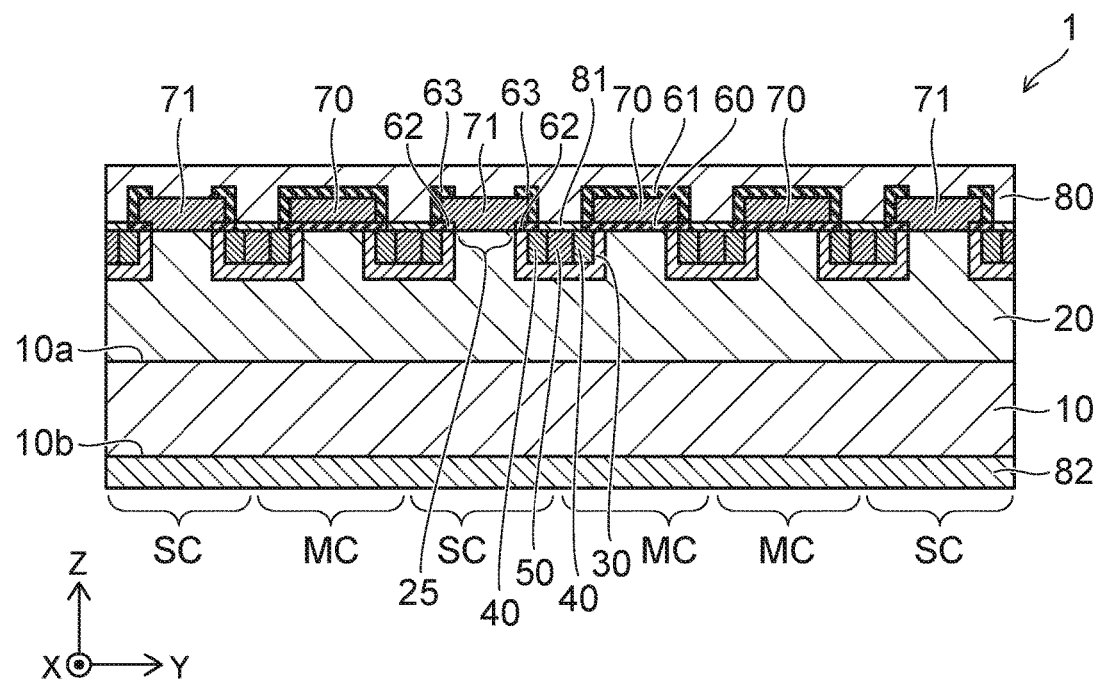
FIG. 1 is a sectional view showing a semiconductor device according to a first embodiment.

According to an embodiment, a semiconductor device includes a first electrode, a second electrode, a first semiconductor region, a plurality of second semiconductor regions, a plurality of third semiconductor regions, a plurality of third electrodes and a plurality of gate electrodes. The first semiconductor region is provided between the first electrode and the second electrode, and a conductivity type of the first semiconductor region is a first conductivity type. The plurality of second semiconductor regions is provided between the first semiconductor region and the second electrode, extends in a first direction in a plane perpendicular to a direction from the first electrode to the second electrode and is arranged in a second direction crossing the first direction, and a conductivity type of the second semiconductor regions is a second conductivity type. The plurality of third semiconductor regions is provided between the plurality of second semiconductor regions and the second electrode and electrically connected to the second electrode, and a conductivity type of the third semiconductor regions is the first conductivity type. The plurality of third electrodes is in Schottky connection with the first semiconductor region located between the second semiconductor regions in the second direction, and the third electrodes extend in the first direction, are arranged in the second direction and are electrically connected to the second electrode. The plurality of gate electrodes is provided via a gate insulating film on the first semiconductor region, the second semiconductor regions and the third semiconductor regions, extends in the first direction, and are arranged parallel to the plurality of third electrodes in the second direction. In a first region in a cross section formed by the second direction and the direction from the first electrode to the second electrode, a first arrangement cycle in the second direction such that ratio of number of the gate electrodes and the third electrodes is m1 to one (m1 being a positive integer) is combined with a second arrangement cycle in the second direction such that the ratio of the number of the gate electrodes and the third electrodes is m2 to one (m2 being a positive integer), thereby the gate electrodes and the third electrodes are arranged parallel in the second direction and periodically with a third arrangement cycle such that the ratio of the number of the gate electrodes and the third electrodes in the first region is m3 to m4 (m3, m4 being positive integers and m3 being more than or equal to m4).

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

FIG. 1 is a sectional view showing a semiconductor device 1.

As shown in FIG. 1, the semiconductor device 1 is provided with a semiconductor region 10 of a first conductivity type, a semiconductor region 20 of the first conductivity type, a semiconductor region 30 of a second conductivity type, a semiconductor region 40 of the first conductivity type, a semiconductor region 50 of the second conductivity type, a gate insulating film 60, an interlayer insulating film 61, an insulating film 62, an interlayer insulating film 63, a gate electrode 70, an anode electrode 71, a source electrode 80, a source contact electrode 81 for providing electrically ohmic connection between the source electrode 80 and the semiconductor regions 40, 50, and a drain electrode 82. The semiconductor device 1 is e.g. an n-type MOSFET based on silicon carbide (SIC) with carriers being electrons.

In the following, an XYZ orthogonal coordinate system is adopted in this specification. The direction from the drain electrode 82 to the source electrode 80 is referred to as "Z-direction". Two directions perpendicular to the Z-direction and orthogonal to each other are referred to as "X-direction" and "Y-direction". FIG. 1 shows a Y-Z cross section of the semiconductor device 1.

The following describes an example where the first conductivity type is n-type and the second conductivity type is p-type.

The semiconductor region 10 contains e.g. silicon carbide. For instance, the conductivity type of the semiconductor region 10 is $n^+$-type. The semiconductor region 10 functions as e.g. a drain region. The semiconductor region 10 has a first surface 10a and a second surface 10b. The second surface 10b is a surface on the opposite side from the first surface 10a.

The term "$n^+$-type" refers to n-type with the effective impurity concentration higher than "$n^-$-type". The same also applies to "$p^+$-type" and "$p^-$-type". The "effective impurity concentration" refers to the concentration of impurity contributing to the conductivity of a semiconductor material. In the case where the semiconductor material contains both an impurity serving as a donor and an impurity serving as an acceptor, the effective impurity concentration is defined as the concentration except the amounts canceling out each other. The n-type impurity is e.g. nitrogen (N) or phosphorus (P). The p-type impurity is e.g. aluminum (Al) or boron (B).

The semiconductor region 20 is provided on the first surface 10a of the semiconductor region 10 and contains e.g. silicon carbide. The conductivity type of the semiconductor region 20 is e.g. $n^-$-type. The semiconductor region 20 is e.g. a drift region.

The semiconductor region 30 is provided in a plurality on the semiconductor region 20 and contains e.g. silicon carbide. The conductivity type of the semiconductor region 30 is e.g. p-type. The semiconductor region 30 is e.g. a base region. The semiconductor region 30 extends in the X-direction.

The semiconductor region 40 is provided in a plurality on the semiconductor region 30 and contains e.g. silicon carbide. The conductivity type of the semiconductor region 40 is e.g. $n^+$-type. The semiconductor region 40 is e.g. a source region. The semiconductor regions 40 extend in the X-direction and are spaced from each other in the Y-direction.

The semiconductor region 50 is provided on the semiconductor region 30 and contains e.g. silicon carbide. The conductivity type of the semiconductor region 50 is e.g. $p^+$-type. The semiconductor region 50 is e.g. a contact region. The semiconductor region 50 extends in the X-direction. The semiconductor region 50 is located between the semiconductor regions 40 adjacent in the Y-direction. In the presence of the semiconductor region 50, when the semiconductor region 20 of the MOSFET is depleted from the interface with the semiconductor region 30 at gate-off, holes in the semiconductor region 30 are ejected through the semiconductor region 50 of the same p-type to the source electrode 80 side (discharging). Conversely, when the depletion layer shrinks at gate-on, holes flow from the source electrode 80 through the semiconductor region 50 into the semiconductor region 30 (charging). When depleted, electrons are ejected from the drain electrode 82 side through the semiconductor region 20.

The gate insulating film 60 is provided in a plurality on the semiconductor regions 20, 30, 40. The gate insulating film 60 contains e.g. silicon oxide (SiO). The gate insulating film 60 may be e.g. a high-k insulating film (high dielectric constant insulating film).

The interlayer insulating film 61 is provided on the gate insulating film 60 and the gate electrode 70. The interlayer insulating film 61 contains e.g. silicon oxide.

The insulating film 62 is provided in a plurality on the semiconductor regions 30, 40. The insulating film 62 contains e.g. the same material as the gate insulating film 60.

The interlayer insulating film 63 is provided on the insulating film 62 and the anode electrode 71. The interlayer insulating film 63 contains e.g. the same material as the interlayer insulating film 61.

The gate electrode 70 is provided on the gate insulating film 60. The gate electrode 70 is surrounded with the gate insulating film 60 and the interlayer insulating film 61. The gate electrodes 70 extend in the X-direction and are spaced from each other in the Y-direction. The gate electrode 70 contains e.g. polycrystalline silicon containing p-type impurity. In order to stabilize the operation, the gate electrode 70 may be partly extended onto the semiconductor region 40 via the gate insulating film 60.

The anode electrode 71 is provided on the semiconductor region 20 and the insulating film 62. The anode electrode 71 is in contact with the semiconductor region 20 located between the insulating films 62 adjacent in the Y-direction. That is, the portion in which the anode electrode 71 is in contact with the semiconductor region 20 constitutes a Schottky barrier diode (hereinafter also referred to as SBD) region 25. The anode electrode 71 is made of a material being capable of Schottky connection with the semiconductor region 20 and determined by the design of the Schottky barrier. The anode electrode 71 is made of e.g. a metal such as titanium (Ti) and molybdenum (Mo), polysilicon (Si), or a compound of silicon and a metal.

Here, the insulating film 62 and the interlayer insulating film 63 are provided to clarify the positional relationship between the anode electrode 71 and the semiconductor region 20, but do not necessarily need to be provided because the anode electrode 71 and the source electrode 80 are equipotential. In this case, in order to stabilize the operation, the anode electrode 71 preferably covers at least part of the semiconductor region 30.

The junction between the anode electrode 71 and the semiconductor region 20 is a Schottky junction. The anode electrode 71 is electrically connected to the source electrode 80. For instance, the anode electrode 71 is in contact with the source electrode 80 through an opening provided in the interlayer insulating film 63.

The source electrode 80 is provided on the semiconductor regions 40, 50, the interlayer insulating films 61, 63, the anode electrode 71, and the source contact electrode 81. The source electrode 80 contains e.g. a metal material. The source electrode 80 is made of e.g. a metal such as nickel (Ni), aluminum (Al), titanium, tungsten (W), molybdenum, copper (Cu), gold (Au), and platinum (Pt).

The source contact electrode 81 is provided between the source electrode 80 and the semiconductor regions 40, 50. The source contact electrode 81 has the purpose of lowering electric resistance by ohmic junction with the semiconductor regions 40, 50. The source contact electrode 81 is made of e.g. a metal such as nickel, titanium, tungsten, and molybdenum, or a compound of silicon and a metal.

The drain electrode 82 is provided on the second surface 10b of the semiconductor region 10. The drain electrode 82 is made of e.g. a metal such as nickel, aluminum, titanium, tungsten, molybdenum, copper, gold, and platinum.

MOSFETs and SBDs are provided in the semiconductor device 1. The semiconductor device 1 includes MOSFET cells (MC) and SBD cells (SC) regularly arranged with a constant cycle in the Y-direction.

Figure 2:
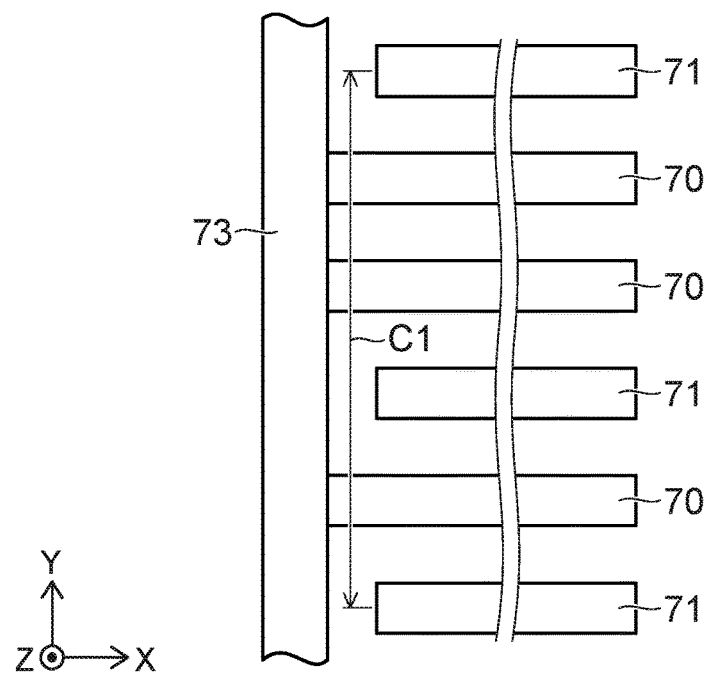
FIG. 2 is a plan view showing a part of the semiconductor device according to the first embodiment.

FIG. 2 is a plan view showing part of the semiconductor device 1. FIG. 2 shows the arrangement of the gate electrodes 70 and the anode electrodes 71.

As shown in FIG. 2, the gate electrode 70 and the anode electrode 71 extend in the X-direction. The end part of the gate electrode 70 is connected to a gate contact 73 extending in the Y-direction. The gate contact 73 is electrically isolated from the anode electrode 71. Thus, the gate electrode 70 is applied with a potential independent of the anode electrode 71.

Next, the arrangement cycle of the MOSFET cells and the SBD cells is described.

In the semiconductor device 1, the MOSFET cells and the SBD cells are arranged with a cycle C1 in the Y-direction. The MOSFET cell is provided with a gate electrode 70. The SBD cell is provided with an anode electrode 71.

In the cycle C1, the SBD cell, the MOSFET cell, the SBD cell, the MOSFET cell, the MOSFET cell, and the SBD cell are arranged in this order in the Y-direction. For instance, the MOSFET cells and the SBD cells are arranged in a plurality on a chip so that the cycle C1 is repeated in the Y-direction.

Next, the operation of the semiconductor device 1 is described.

First, in the operation of the MOSFET, the drain electrode 82 is positively biased relative to the source electrode 80. The gate electrode 70 is applied with a voltage more than or equal to a threshold. Thus, a channel is formed in the semiconductor region 30 (base region) located between the semiconductor region 20 and the semiconductor region 40. Accordingly, a current flows from the drain electrode 82 to the source electrode 80. That is, the MOSFET is turned on.

When the MOSFET is in the on-state, electrons are injected from the source electrode 80 side. Thus, an electron current flows from the source electrode 80 to the drain electrode 82.

When the voltage applied to the gate electrode 70 is lowered, the concentration of electrons induced at the interface between the semiconductor region 30 and the gate insulating film 60 decreases. This blocks the continuity between the semiconductor region 20 and the semiconductor region 40. That is, the MOSFET is turned off.

In the operation of the SBD, the drain electrode 82 is negatively biased relative to the source electrode 80. When exceeding the rising voltage of the diode due to the Schottky junction between the anode electrode 71 and the semiconductor region 20, a current flows from the source electrode 80 to the drain electrode 82. That is, the SBD is turned on.

Also in the p-n junction diode between the semiconductor region 30 and the semiconductor region 20, when exceeding its rising voltage, a current flows from the source electrode 80 to the drain electrode 82 through the p-n junction diode.

Next, the effect of this embodiment is described.

Figure 3:
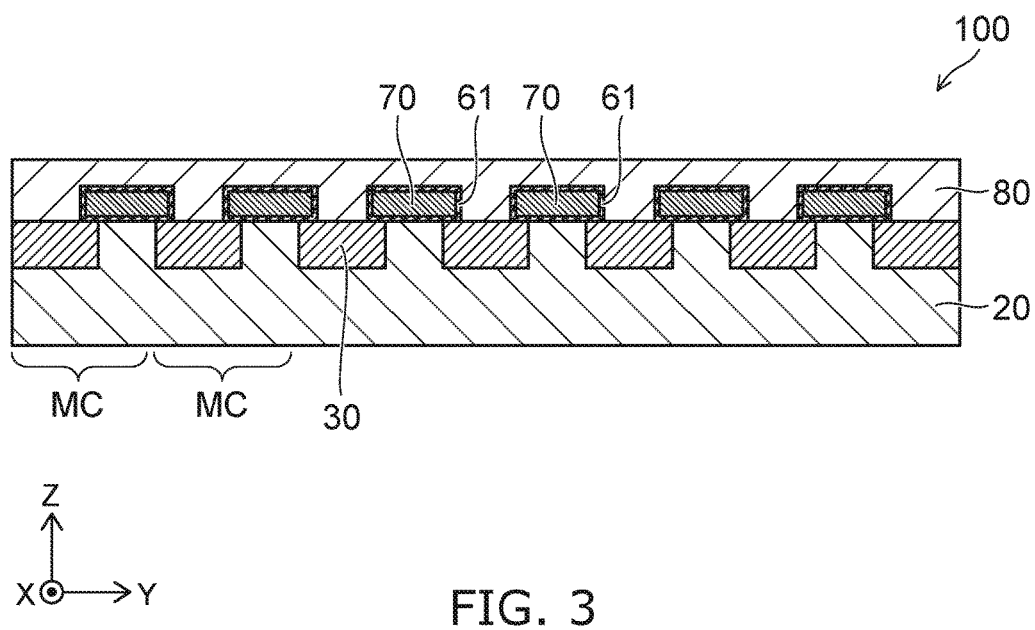
FIGS. 3 to 5 are views describing electrical characteristics of semiconductor devices according to reference examples.
Figure 4:
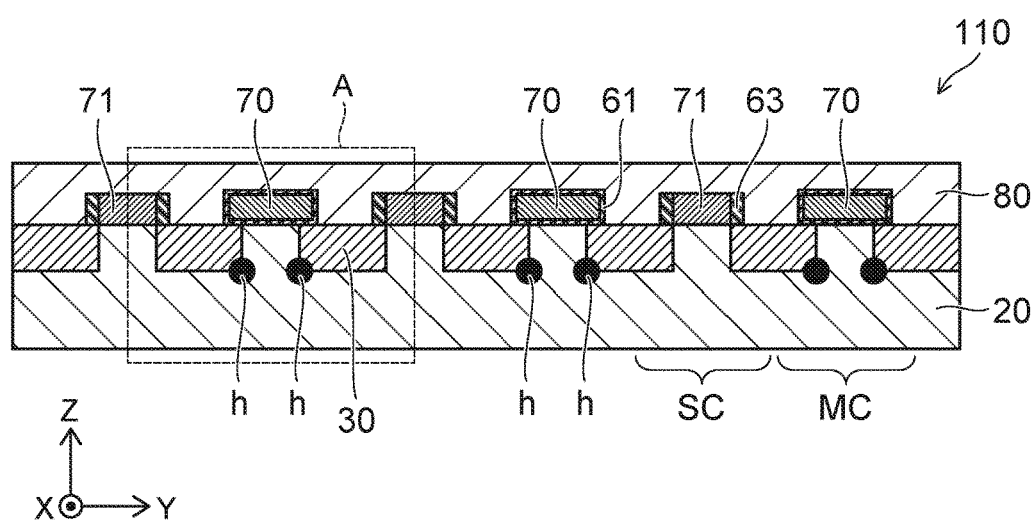
Figure 5:
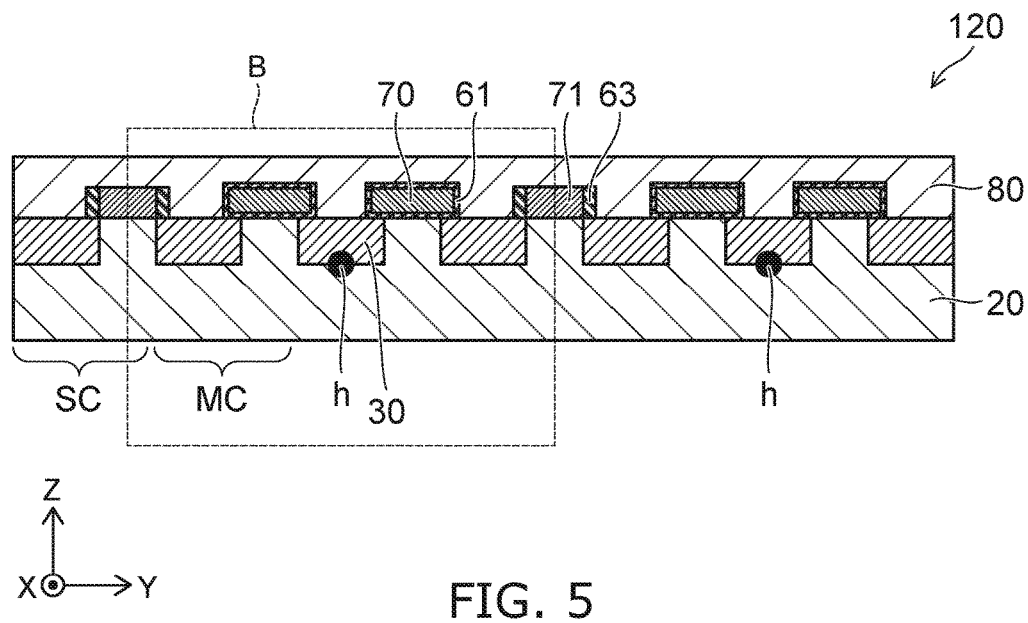
Figure 6:
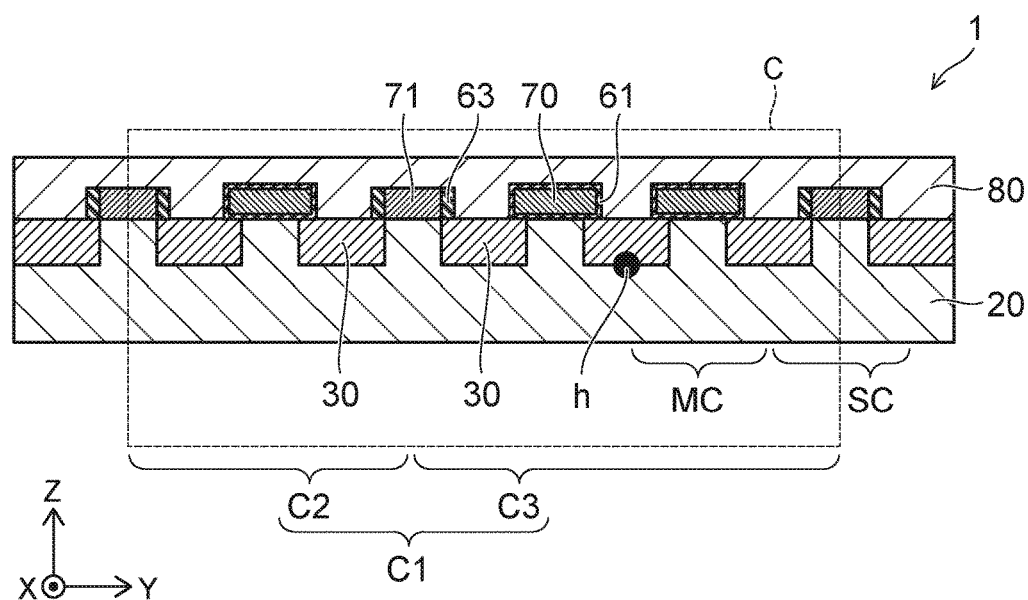
FIG. 6 is a sectional view showing the semiconductor device according to the first embodiment.
Figure 7:
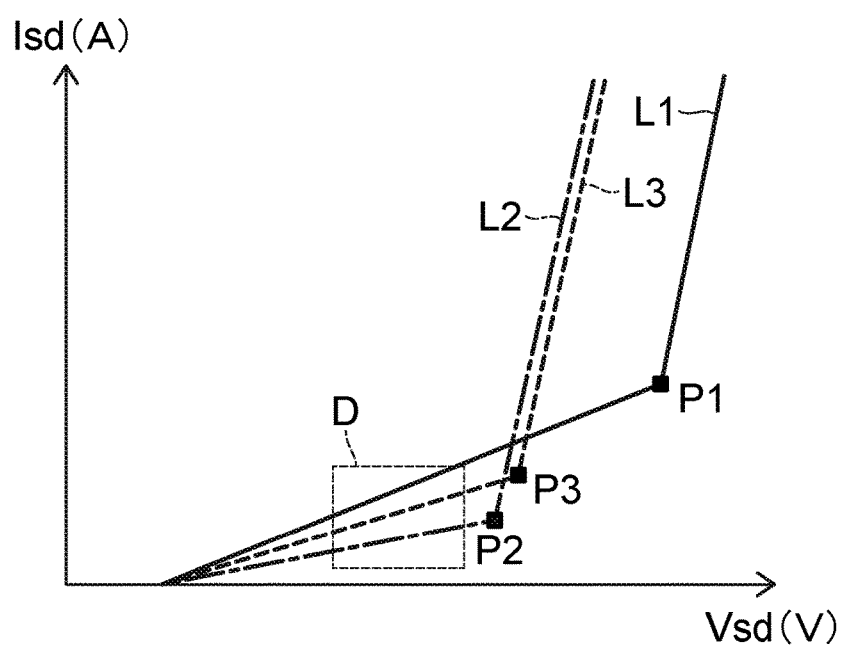
FIG. 7 is a view describing electrical characteristics of the semiconductor devices according to the reference examples and the first embodiment.

FIGS. 3 to 5 describe the electrical characteristics of a semiconductor device according to a reference example. FIG. 6 describes the electrical characteristics of the semiconductor device according to this embodiment. FIG. 7 describes the electrical characteristics of the semiconductor device according to the reference example and this embodiment.

The region shown in FIGS. 3 to 6 corresponds to part of the region shown in FIG. 1. FIGS. 3 to 6 simplify part of the region shown in FIG. 1 and omit part of the components.

FIG. 7 is a graph showing the relation of the voltage (V) between the drain electrode and the source electrode versus the drain current (A) in the semiconductor device according to the reference example and this embodiment. In FIG. 7, the line L1 represents the relation of the voltage between the drain electrode and the source electrode versus the drain current in the semiconductor device 110 of the reference example. The line L2 represents the relation of the voltage between the drain electrode and the source electrode versus the drain current in the semiconductor device 120 of the reference example. The line L3 represents the relation of the drain current to the voltage between the drain electrode and the source electrode in the semiconductor device 1 of this embodiment.

The vertical axis of FIG. 7 represents the drain current Isd (A). The horizontal axis of FIG. 7 represents the voltage Vsd (V) between the drain electrode and the source electrode. Regarding the voltage Vsd between the drain electrode and the source electrode, the drain electrode is applied with a negative voltage. The source potential being relatively positive is represented as positive in the graph.

As shown in FIG. 3, in the semiconductor device 100, MOSFET cells (MC) are arranged in the Y-direction, and no SBD cells (SC) are provided. In the semiconductor device 100 without SBD cells incorporated therein, when a reverse bias is applied at gate-off, a current flows in the diode. However, no electron current flows because no SBD cells are provided. Thus, the current is entirely the current of the p-n diode accompanied with hole injection.

As shown in FIG. 4, in the semiconductor device 110, SBD cells (SC) are provided to suppress injection of holes flowing in the built-in diode. In such a structure of the semiconductor device 110 with MOSFET cells (MC) and SBD cells (SC) arranged alternately in the Y-direction, when a reverse voltage is applied at gate-off of the MOSFET, a current flows in the SBD. At this time, if the threshold of the p-n junction is exceeded, holes h are injected from the semiconductor region 30. This phenomenon originates from the position farthest from the SBD cell in the semiconductor region 30. That is, holes h are injected into the position farthest in the Y-direction from the SBD cell in the semiconductor region 30 immediately below the MOSFET cell. For instance, as shown in the region A of FIG. 4, the MOSFET cells and the SBD cells are arranged alternately in the Y-direction so that the ratio of the number of MOSFET cells and SBD cells in an arbitrary cross section is one to one. Such an arrangement is repeated in the Y-direction. Then, holes h are injected from the h-part (black dot), i.e. position farthest in the Y-direction from two SBD cells in the semiconductor region 30 immediately below the MOSFET cell between the two SBD cells. For instance, in the region A of FIG. 4, holes h are injected into the end parts of the semiconductor regions 30 opposed to each other in the Y-direction.

As shown in FIG. 5, in the semiconductor device 120, MOSFET cells (MC) and SBD cells (SC) are arranged with a prescribed cycle in the Y-direction. As shown in the region B of FIG. 5, the SBD cell, the MOSFET cell, the MOSFET cell, and the SBD cell are arranged in this order in the Y-direction. The MOSFET cells and the SBD cells are arranged in the Y-direction so that the ratio of the number of MOSFET cells and SBD cells in an arbitrary cross section is two to one.

In such a structure of the semiconductor device 120 with MOSFET cells (MC) and SBD cells (SC) arranged in the Y-direction, when a reverse voltage is applied at gate-off of the MOSFET, a current flows in the SBD. At this time, if the threshold of the p-n junction is exceeded, holes h are injected from the semiconductor region 30. This phenomenon originates from the position farthest from the SBD cell in the semiconductor region 30. That is, holes h are injected from the h-part (black dot), i.e. the position farthest in the Y-direction from two SBD cells in the semiconductor region 30 between the two SBD cells.

The semiconductor device 110 of FIG. 4 and the semiconductor device 120 of FIG. 5 are compared. The semiconductor device 120 includes fewer SBD cells (SC) than the semiconductor device 110. Thus, in the semiconductor device 120, the electron current of the SBD does not flow in a large amount. However, the semiconductor device 120 includes more MOSFET cells. Thus, in the semiconductor device 120, the current flowing in the MOSFET at gate-on is larger. However, in the semiconductor device 120, the rising voltage of the p-n diode is lower. Thus, in the semiconductor device 120, hole injection is more likely to occur.

The semiconductor device 110 of FIG. 4 and the semiconductor device 120 of FIG. 5 have a repeated structure in which there are m (m being an integer of one or more) MOSFET cells (MC) for one SBD cell (SC). In such a structure, it is difficult to achieve a design for optimizing the tradeoff between the current of the MOSFET cell at gate-on and the current of the diode in the synchronous rectification mode at gate-off. In the design for passing a desired current in the SBD, the area of the MOSFET cell is made excessively large. In the design for passing a desired current in the MOSFET, the area of the SBD cell is made excessively large. Then, the device area is made larger. This increases the fraction defective and decreases the yield.

On the other hand, as shown in FIG. 6, in the semiconductor device 1 according to this embodiment, MOSFET cells (MC) and SBD cells (SC) are arranged with the cycle C1 in the Y-direction. As shown in the region C of FIG. 6, in the cycle C1, the SBD cell, the MOSFET cell, the SBD cell, the MOSFET cell, the MOSFET cell, and the SBD cell are arranged in this order in the Y-direction. The cycle C1 is composed of a cycle C2 and a cycle C3. As shown in the region C of FIG. 6, in the cycle C2, the MOSFET cells and the SBD cells are arranged in the Y-direction so that the ratio of the number of MOSFET cells and SBD cells in an arbitrary cross section is one to one. In the cycle C3, the MOSFET cells and the SBD cells are arranged in the Y-direction so that the ratio of the number of MOSFET cells and SBD cells in an arbitrary cross section is two to one. That is, in the cycle C1, the MOSFET cells and the SBD cells are arranged in the Y-direction so that the ratio of the number of MOSFET cells and SBD cells in an arbitrary cross section is three to two.

In the structure of the semiconductor device 1 arranged with the cycle C1, when a reverse voltage is applied at gate-off of the MOSFET, a current flows in the SBD. At this time, if the threshold of the p-n junction is exceeded, holes h are injected from the semiconductor region 30. In this phenomenon, holes h are injected into the position farthest in the Y-direction from the SBD cell in the cycle C3 in the semiconductor region 30 located between the MOSFET cells in the cycle C3. In such a structure of the semiconductor device 1, holes h are injected from the h-part (black dot) of the semiconductor region 30 in the cycle C3 earlier than from the semiconductor region 30 in the cycle C2. This is because the potential difference from the source electrode 80 is larger as the distance from the SBD cell is farther in the laterally spread portion of the current path between the source and the drain.

Here, as shown in FIG. 7, the line L1, the line L2, and the line L3 are compared in the region D. The slope of the line L1 is larger than the slope of the line L3. The slope of the line L3 is larger than that of the line L2. In the region D, the magnitude of the slope of the line L1, the line L2, and the line L3 represents the magnitude of the electron current of the SBD. The magnitude of the electron current of the SBD is proportional to the ratio of SBD cells occupied in the semiconductor device. That is, as shown in the region A of FIG. 4, in the semiconductor device 110, the MOSFET cells and the SBD cells are arranged alternately in the Y-direction at a ratio of one to one. As shown in the region B of FIG. 5, in the semiconductor device 120, the MOSFET cells and the SBD cells are arranged in the Y-direction at a ratio of two to one. In contrast, as shown in the region C of FIG. 6, in the semiconductor device 1, the MOSFET cells and the SBD cells are arranged in the Y-direction at a ratio of three to two. Thus, the slope of the line L1 is larger than the slope of the line L3. The slope of the line L3 is larger than the slope of the line L2.

On the other hand, in the semiconductor device 1, the increase in the ratio of SBD cells means the decrease in the ratio of MOSFET cells. This decreases the current flowing in the MOSFET at gate-on, resulting in a tradeoff.

As shown in FIG. 7, the slope of the line L1, the line L2, and the line L3 increases at the point P1, the point P2, and the point P3, respectively. Comparing the point P1 of the line L1 with the point P2 of the line L2, the point P2 is smaller than the point P1 in the voltage Vsd between the drain electrode and the source electrode. Comparing the point P2 of the line L2 with the point P3 of the line L3, the point P2 and the point P3 are generally equal in the voltage Vsd between the drain electrode and the source electrode. The slope of the line L1, the line L2, and the line L3 changes at the point P1, the point P2, and the point P3. These points represent the rising voltage of the p-n diode. Thus, the semiconductor device 1 is lower than the semiconductor device 110 in the voltage at which holes h are injected.

In the semiconductor device 1 of this embodiment, the MOSFET cells (MC) and the SBD cells (SC) are arranged in the Y-direction so that the ratio of the number of MOSFET cells and SBD cells in an arbitrary cross section is three to two. This achieves an optimization between the area of MOSFET cells and the area of SBD cells. The SBD cell suppresses the hole current flowing in the built-in diode. This improves reliability and enhances the flexibility of the ratio between MOSFETs and SBDs. Furthermore, the yield is improved, and the switching loss in the semiconductor device can be reduced.

This embodiment can provide a semiconductor device having improved reliability.

In this embodiment, the MOSFET cells (MC) and the SBD cells (SC) are arranged in the Y-direction at a ratio of three to two. However, this embodiment is not limited thereto. For instance, it is possible to adopt an arbitrary structure such that the ratio of MOSFET cells and SBD cells are one to n (n being an arbitrary positive number). In this case, for instance, in the region C of FIG. 6, the MOSFET cell and the SBD cell in the cycle C2 and the cycle C3 are arranged in the Y-direction so that the ratio of the number of MOSFET cells and SBD cells in an arbitrary cross section is an arbitrary ratio. Thus, as described above, optimization is achieved between the areas of MOSFET cells and SBD cells. This can suppress the hole current flowing in the built-in diode, improve reliability, and enhance the flexibility of the ratio between MOSFETs and SBDs. Thus, the yield can be improved, and the switching loss can be reduced.

Second Embodiment

Figure 8:
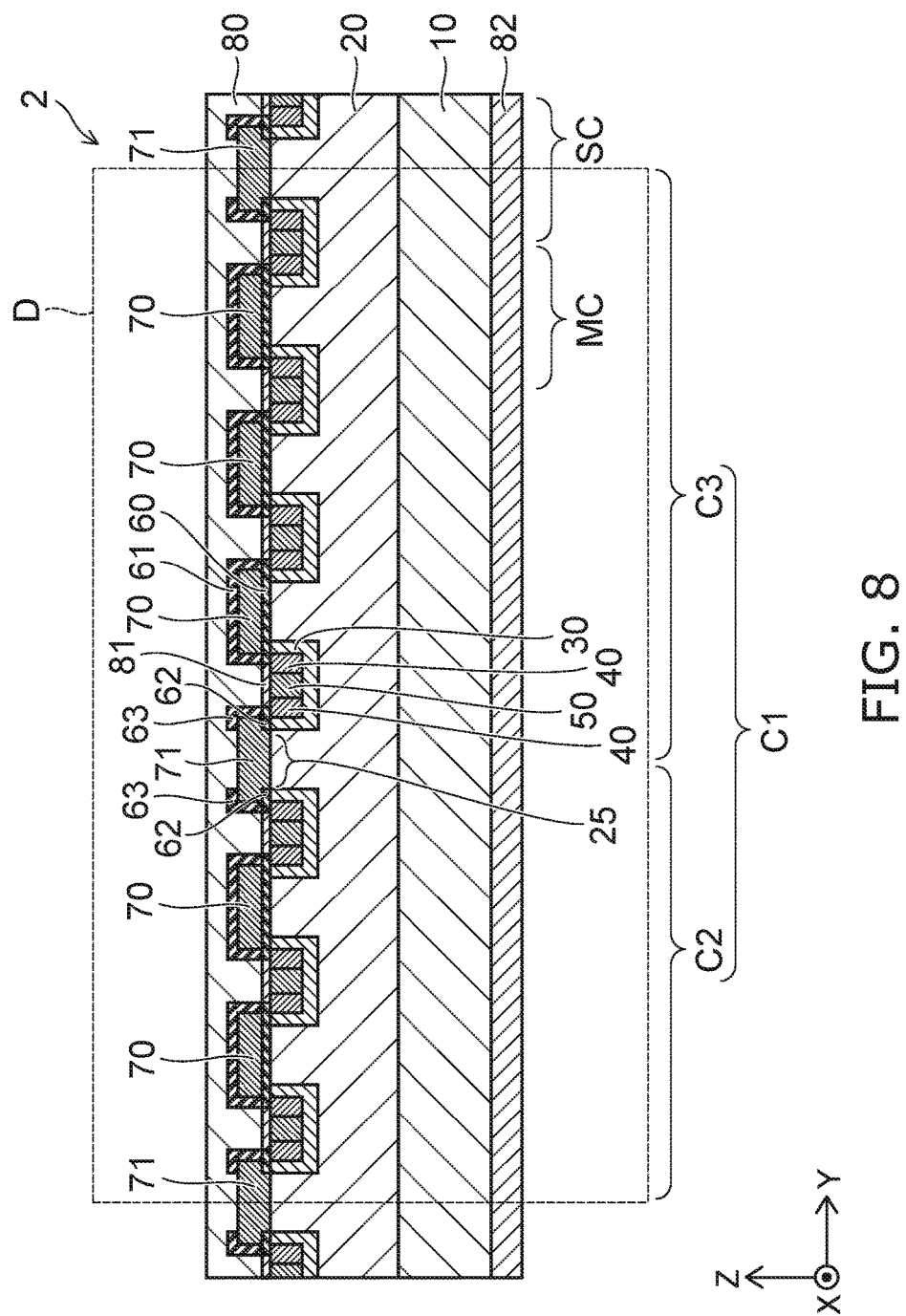
FIG. 8 is a sectional view showing a semiconductor device according to a second embodiment.

FIG. 8 is a sectional view showing a semiconductor device 2.

The semiconductor device 2 of this embodiment is different from the semiconductor device 1 of the first embodiment in the Y-direction arrangement (cycles C1-C3) of MOSFET cells (MC) and SBD cells (SC). The rest of the configuration is the same as that of the first embodiment, and the detailed description thereof is omitted.

As shown in FIG. 8, the semiconductor device 2 is provided with a semiconductor region 10 of a first conductivity type, a semiconductor region 20 of the first conductivity type, a semiconductor region 30 of a second conductivity type, a semiconductor region 40 of the first conductivity type, a semiconductor region 50 of the second conductivity type, a gate insulating film 60, an interlayer insulating film 61, an insulating film 62, an interlayer insulating film 63, a gate electrode 70, an anode electrode 71, a source electrode 80, a source contact electrode 81, and a drain electrode 82.

MOSFETs and SBDs are provided in the semiconductor device 2. The semiconductor device 2 includes MOSFET cells (MC) and SBD cells (SC) regularly arranged with a constant cycle in the Y-direction.

Next, the arrangement cycle of the MOSFET cells and the SBD cells is described.

In the semiconductor device 2, the MOSFET cells and the SBD cells are arranged with a cycle C1 in the Y-direction. The MOSFET cell is provided with a gate electrode 70. The SBD cell is provided with an anode electrode 71.

As shown in the region D of FIG. 8, in the cycle C1, the SBD cell, the MOSFET cell, the MOSFET cell, the SBD cell, the MOSFET cell, the MOSFET cell, the MOSFET cell, and the SBD cell are arranged in this order in the Y-direction.

The cycle C1 is composed of a cycle C2 and a cycle C3. In the cycle C2, the MOSFET cells and the SBD cells are arranged in the Y-direction so that the ratio of the number of MOSFET cells and SBD cells in an arbitrary cross section is two to one. In the cycle C3, the MOSFET cells and the SBD cells are arranged in the Y-direction so that the ratio of the number of MOSFET cells and SBD cells in an arbitrary cross section is three to one. That is, in the cycle C1, the MOSFET cells and the SBD cells are arranged in the Y-direction so that the ratio of the number of MOSFET cells and SBD cells in an arbitrary cross section is five to two.

The effect of this embodiment is the same as the effect of the first embodiment.

Third Embodiment

Figure 9:
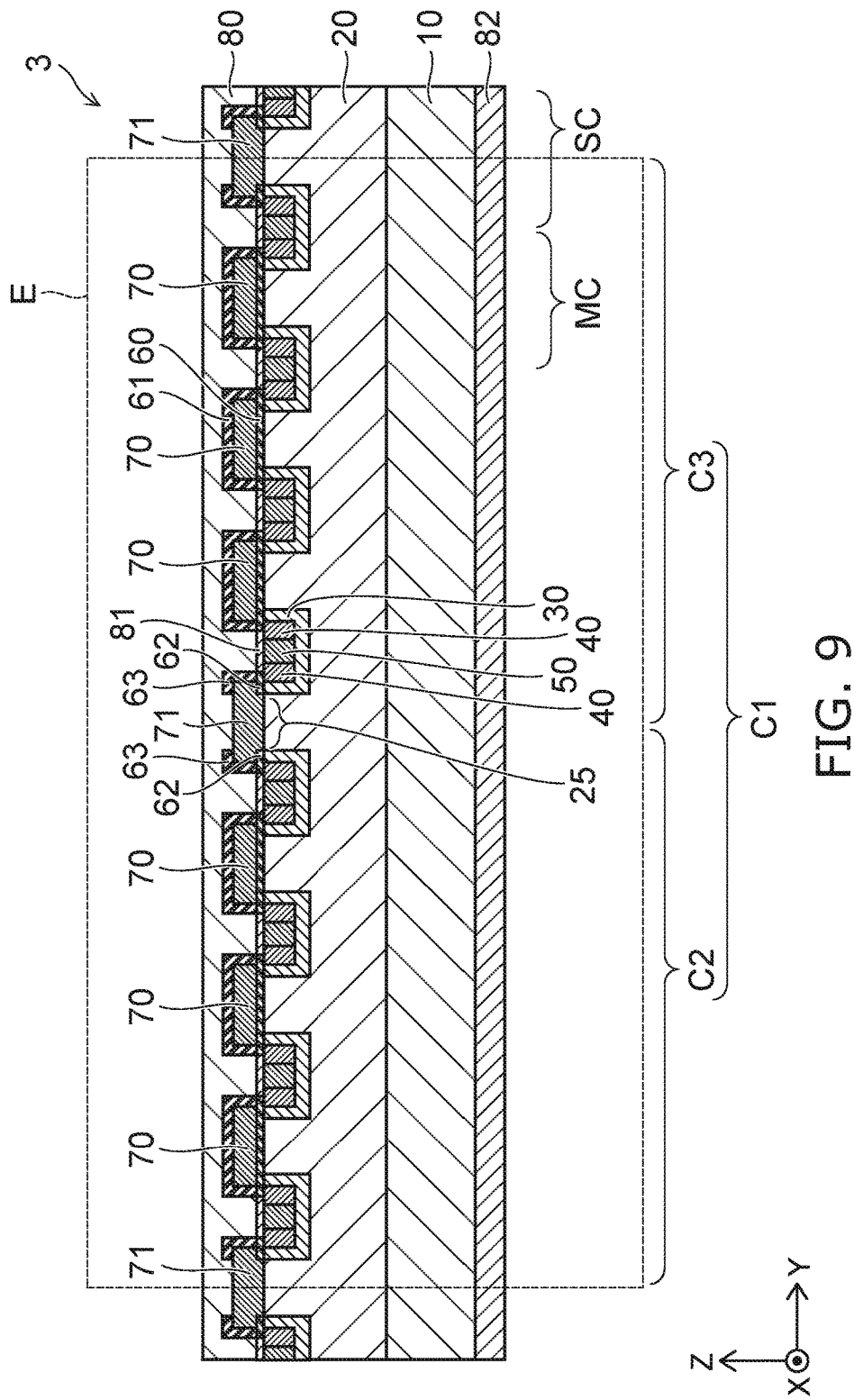
FIG. 9 is a sectional view showing a semiconductor device according to a third embodiment.

FIG. 9 is a sectional view showing a semiconductor device 3.

The semiconductor device 3 of this embodiment is different from the semiconductor device 1 of the first embodiment in the Y-direction arrangement (cycles C1-C3) of MOSFET cells (MC) and SBD cells (SC). The rest of the configuration is the same as that of the first embodiment, and the detailed description thereof is omitted.

As shown in FIG. 9, the semiconductor device 3 is provided with a semiconductor region 10 of a first conductivity type, a semiconductor region 20 of the first conductivity type, a semiconductor region 30 of a second conductivity type, a semiconductor region 40 of the first conductivity type, a semiconductor region 50 of the second conductivity type, a gate insulating film 60, an interlayer insulating film 61, an insulating film 62, an interlayer insulating film 63, a gate electrode 70, an anode electrode 71, a source electrode 80, a source contact electrode 81, and a drain electrode 82.

MOSFETs and SBDs are provided in the semiconductor device 3. The semiconductor device 3 includes MOSFET cells (MC) and SBD cells (SC) regularly arranged with a constant cycle in the Y-direction.

Next, the arrangement cycle of the MOSFET cells and the SBD cells is described.

In the semiconductor device 3, the MOSFET cells and the SBD cells are arranged with a cycle C1 in the Y-direction. The MOSFET cell is provided with a gate electrode 70. The SBD cell is provided with an anode electrode 71.

As shown in the region E of FIG. 9, in the cycle C1, the SBD cell, the MOSFET cell, the MOSFET cell, the MOSFET cell, the SBD cell, the MOSFET cell, the MOSFET cell, the MOSFET cell, and the SBD cell are arranged in this order in the Y-direction.

The cycle C1 is composed of a cycle C2 and a cycle C3. In the cycle C2, the MOSFET cells and the SBD cells are arranged in the Y-direction so that the ratio of the number of MOSFET cells and SBD cells in an arbitrary cross section is three to one. In the cycle C3, the MOSFET cells and the SBD cells are arranged in the Y-direction so that the ratio of the number of MOSFET cells and SBD cells in an arbitrary cross section is three to one. That is, in the cycle C1, the MOSFET cells and the SBD cells are arranged in the Y-direction so that the ratio of the number of MOSFET cells and SBD cells in an arbitrary cross section is three to one.

The effect of this embodiment is the same as the effect of the first embodiment.

As described above, as an example, the semiconductor devices according to the embodiments have been described in the case where the first conductivity type is n-type and the second conductivity type is p-type. However, the first conductivity type may be p-type, and the second conductivity type may be n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device comprising:
a first electrode;
a second electrode;

a first semiconductor region of a first conductivity type provided between the first electrode and the second electrode;

a plurality of second semiconductor regions of a second conductivity type provided between the first semiconductor region and the second electrode, extending in a first direction in a plane perpendicular to a direction from the first electrode to the second electrode, and arranged in a second direction crossing the first direction;

a plurality of third semiconductor regions of the first conductivity type provided between the plurality of second semiconductor regions and the second electrode and electrically connected to the second electrode;

a plurality of third electrodes being in Schottky connection with the first semiconductor region located between the second semiconductor regions in the second direction, the third electrodes extending in the first direction, being arranged in the second direction, and being electrically connected to the second electrode; and a plurality of gate electrodes provided via a gate insulating film on the first semiconductor region, the second semiconductor regions, and the third semiconductor regions, extending in the first direction, and arranged parallel to the plurality of third electrodes in the second direction, in a first region in a cross section formed by the second direction and the direction from the first electrode to the second electrode, a first arrangement cycle in the second direction such that ratio of number of the gate electrodes and the third electrodes is m1 to one (m1 being a positive integer) being combined with a second arrangement cycle in the second direction such that the ratio of the number of the gate electrodes and the third electrodes is m2 to one (m2 being a positive integer), thereby the gate electrodes and the third electrodes being arranged parallel in the second direction and periodically with a third arrangement cycle such that the ratio of the number of the gate electrodes and the third electrodes in the first region is m3 to m4 (m3, m4 being positive integers and m3 being more than or equal to m4).

2. The device according to claim 1, wherein m1 and m2 are positive integers from one to five.

3. The device according to claim 1, wherein m2 is equal to m1 or m1+1.

4. The device according to claim 1, wherein
m1 is equal to m2, and
m1 and m2 are one, two, three, four, or five.

5. The device according to claim 1, wherein m1 is one, and m2 is two.

6. The device according to claim 1, wherein m1 is two, and m2 is three.

7. The device according to claim 1, wherein m1 is three, and m2 is four.

8. The device according to claim 1, wherein m1 is four, and m2 is five.

* * * * *